United States Patent [19]
Bae

[11] Patent Number: 5,826,004
[45] Date of Patent: Oct. 20, 1998

[54] INPUT/OUTPUT DEVICE WITH SELF-TEST CAPABILITY IN AN INTEGRATED CIRCUIT

[75] Inventor: Jeong Hwan Bae, Kyungki-Do, Rep. of Korea

[73] Assignee: LG Semicon Co., Ltd., Cheongju, Rep. of Korea

[21] Appl. No.: 574,478

[22] Filed: Dec. 19, 1995

[51] Int. Cl.[6] .................. G01R 31/3185; G06F 12/00
[52] U.S. Cl. .................. 395/183.01; 395/183.06; 395/832; 395/836; 395/872
[58] Field of Search .................. 395/832, 836, 395/872, 183.01, 183.06, 183.12, 183.19

[56] References Cited

U.S. PATENT DOCUMENTS

| | | | |
|---|---|---|---|
| 4,509,119 | 4/1985 | Gumaer et al. | 364/200 |
| 4,639,919 | 1/1987 | Chang et al. | 371/27 |
| 5,025,205 | 6/1991 | Mydill et al. | 324/73.1 |
| 5,165,066 | 11/1992 | Buraschi | 257/48 |
| 5,524,232 | 6/1996 | Hajeer | 395/442 |
| 5,608,736 | 3/1997 | Bradford et al. | 371/22.3 |

OTHER PUBLICATIONS

Niel H.E. Weste and Kamran Eshraghian, "Principles of CMOS VLSI Design, A Systems Perspective", Addison–Wesley Publishing Company, p. 229 (1985).

*Primary Examiner*—Thomas C. Lee
*Assistant Examiner*—Rehana Perveen
*Attorney, Agent, or Firm*—Fleshner & Kim

[57] ABSTRACT

An input/output device in an integrated circuit including a plurality of input buffer units for buffering a data signal provided through each input pin or a test data signal to output it to a core logic, and outputting an inverted test data signal, according to a first test signal; a plurality of output buffer units for selecting and buffering the data signal provided from the core logic or the test data signal, providing the buffered data to each output pin, and outputting an inverted test data signal, according to the first test signal; and a plurality of input/output buffer units for buffering the data signal provided from the core logic or the test data signal to output it to each input/output pin and output an inverted test data signal, and buffering the data signal inputted through each input/output pin to output it to the core logic.

15 Claims, 4 Drawing Sheets

INPUT/OUTPUT DEVICE WITH SELF-TEST CAPABILITY IN AN INTEGRATED CIRCUIT

BACKGROUND OF THE INVENTION

1. Field of the Invention

The present invention relates to an input/output device in an integrated circuit, and more particularly to an input/output device in a highly integrated circuit having a plurality of interface pins by which an electric test is effectively performed and whereby the time required for performing the electric test is reduced.

2. Description of the Prior Art

In general, when an integrated circuit is designed, electrical characteristics of the designed integrated circuit need to be tested. The tests regarding the electrical characteristics largely includes a DC characteristics test and a functional test.

The DC characteristics test refers to a test regarding characteristics of buffers which connect external pins to a core logic, including tests for the level of an input voltage $V_{IH}/V_{IL}$, the level of an output voltage $V_{OH}/V_{OL}$, the level of an output current $I_{OH}I_{OL}$, existence or nonexistence of an open or a short circuit, or a leakage current. The functional test refers to a test regarding a logical operation and the existence or nonexistence of a fault in the core logic arranged in the integrated circuit.

Figure 1:
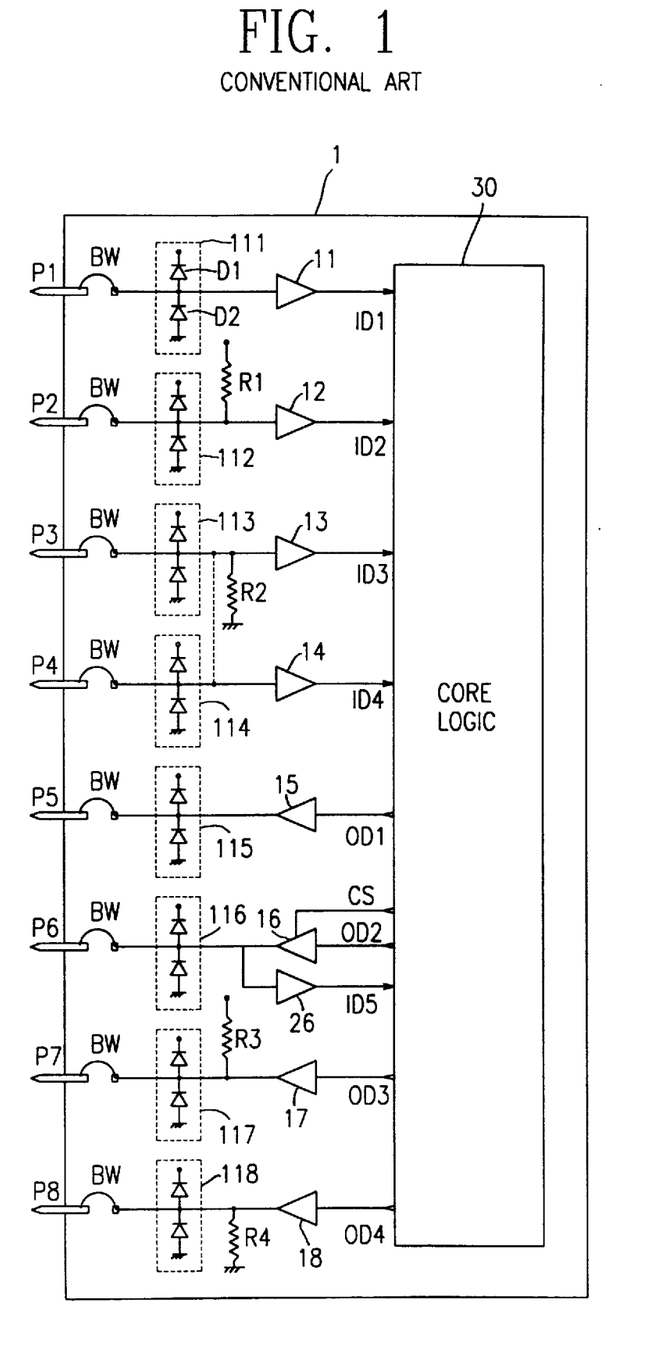
FIG. 1 is a circuit diagram of an input/output device in a conventional integrated circuit.

With reference to FIG. 1, a conventional input/output device in an integrated circuit includes, in case of having eight interface pins P1–P8 in an integrated circuit 1, a diode unit 111 connected to a pin P1 by a bonding wire BW; an input buffer 11 connected to the diode unit 111 for buffering a data signal provided through the pin P1; a core logic 30 for suitably processing a data signal ID1 provided from the input buffer 11; a diode unit 112 connected to a pin P2 by a bonding wire BW; a pull-up resistance R1 of which one end is connected to the diode unit 112 and to the other end of which a power supply voltage VCC is applied; an input buffer 12 connected to the diode unit 112 for buffering the data signal provided through the pin P2 and outputting a data signal ID2 to the core logic 30; a diode unit 113 connected to a pin P3 by a bonding wire BW; a pull-down resistance R2 of which one end is connected to the diode unit 113 and the other end is grounded; an input buffer 13 connected to the diode unit 113 for buffering the data signal provided through the pin P3 and outputting a data signal ID3 to the core logic 30; a diode unit 114 connected to a pin P4 by a bonding wire BW; an input buffer 14 connected to the diode unit 114 for buffering the data signal provided through the pin P4 and outputting a data signal ID4 to the core logic 30; a diode unit 115 connected to a pin PS by a bonding wire BWW; an output buffer 15 connected to the diode unit 115 for buffering a data signal OD1 provided from the core logic 30 and outputting the buffered data signal to the pin P5; a diode unit 116 connected to a pin P6 by a bonding wire BW; an input buffer 26 connected to the diode unit 116 for buffering the data signal provided through the pin P6 and outputting the buffered data signal ID5 to the core logic 30; an output buffer 16 for buffering a data signal OD2 according to an input/output control signal CS provided from the core logic 30 and outputting the buffered data signal to the pin P6; a diode unit 117 connected to a pin P7 by a bonding wire BW; a pull-up resistance R3 of which one end is connected to the diode unit 117 and to the other end of which a power supply voltage VCC is applied; an output buffer 17 connected to the diode unit 117 for buffering a data signal OD3 provided from the core logic 30 and outputting the buffered data signal to the pin P7; a diode unit 118 connected to a pin P8 by a bonding wire BW; a pull-down resistance R4 of which one end is connected to the diode unit 118 and the other end thereof is grounded; and an output buffer 18 connected to the diode unit 118 for buffering a data signal OD4 provided from the core logic 30 and outputting the data signal to the pin P8.

The diode unit 111 includes a diode D1 having its cathode connected to the pin P1 and its anode connected to power supply voltage VCC; and a diode D2 having its anode connected to the cathode of the diode D1 and its cathode connected to ground. The other diode units 112–118 have the same construction as that of the diode unit 111.

Figure 2:
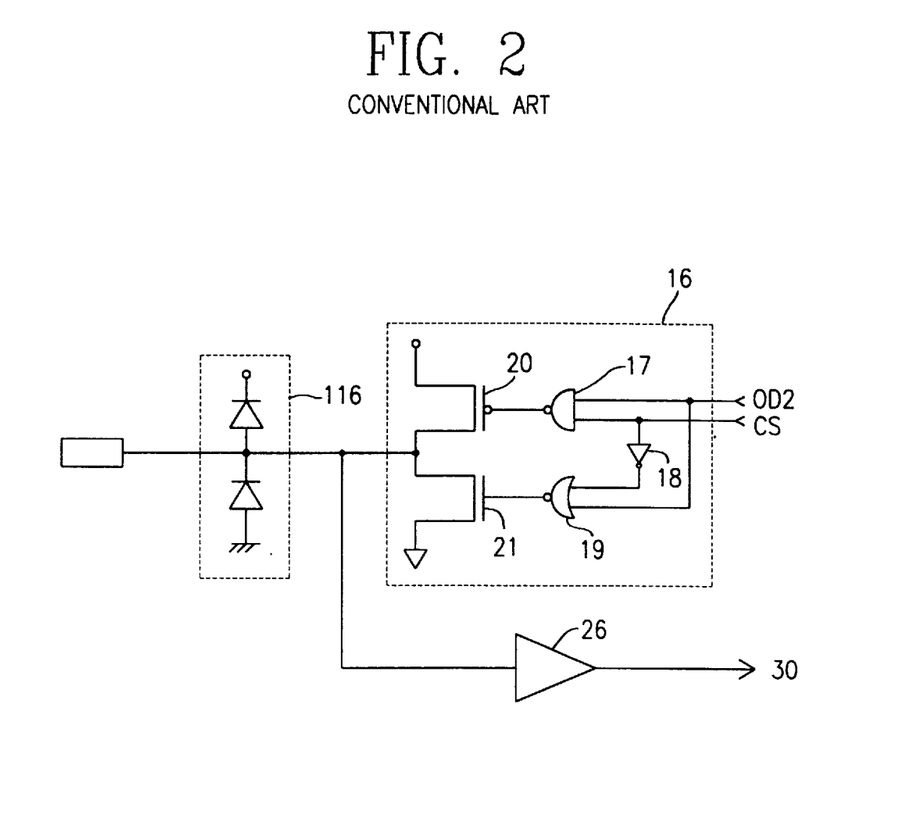
FIG. 2 is a detailed view of an input/output buffer of FIG. 1.

The output buffer 16 includes, as shown in FIG. 2, a NAND gate 17 for NANDing the data signal OD2 and the input/output control signal CS each provided from the core logic 30; an invertor 18 for inverting the input/output control signal CS; a NOR gate 19 for NORing an output signal of the invertor 18 and the data signal OD2; a PMOS transistor 20 having a source connected to the power supply voltage and a gate to which an output signal of the NAND gate 17 is inputted; and an NMOS transistor 21 having a drain to which the drain of the PMOS transistor 20 is connected, a gate to which an output signal of the NOR gate 19 is inputted and a source connected to ground.

The operation of the input/output device in a conventional integrated circuit and the test process of the input/output device will now be described.

When a high or a low level data signal is inputted to the integrated circuit 1 through the input pins P1, P2, P3 and P4, the levels of the inputted data signals are maintained constant by the diode units 111, 112, 113 and 114. The maintained data signals are respectively buffered by the input buffers 11, 12, 13 and 14 each corresponding to the pins P1, P2, P3 and P4, and data signals ID1, ID2, ID3 and ID4 are respectively provided to the core logic 30.

The data signals OD1, OD3 and OD4 respectively provided from the core logic 30 are respectively buffered by the output buffers 15, 17 and 18, and the levels of the buffered data signals are maintained constant by the diode units 115, 117 and 118. The maintained data signals are outputted to the output pins P5, P7 and P8, respectively.

As to the output buffer 16, in case that a low level input/output control signal CS provided from the core logic 30 is inputted to both the NAND gate 17 and the invertor 18, a high level signal is outputted to the gate of the PMOS transistor 20 by the NAND gate 17, while a low level signal is outputted to the gate of the NMOS transistor 21 via the invertor 18 and the NOR gate 19. Accordingly, the output buffer 16 is turned off and the pin P6 is used as an input pin, so that an input data signal is buffered by the output buffer 26 after sequentially passing through the pin P6 and the diode unit 116 and a data signal ID5 is outputted to the core logic 30.

On the other hand, in case that a high level input/output control signal CS is provided from the core logic 30 to both the NAND gate 17 and the invertor 18, the PMOS transistor 20 is turned on while the NMOS transistor 21 is turned off in response to the high level data signal OD2, so that a high level data signal is outputted to the pin P6, whereas the PMOS transistor 20 is turned off while the NMOS transistor 21 is turned on in response to the low level data signal OD2, so that the low level data signal is outputted to the pin P6. Resultantly, the pin P6 is used as an output pin.

The test process of the conventional input/output device will now be described.

In the test regarding the existence or nonexistence of open and short circuits, an approximately 100 μA current is applied to each pin P1–P8 so that a voltage at each pin P1–P8 can be measured. Upon measurement, normal leads have a voltage of 0.7V–0.9V owing to the diodes arranged in the diode unit connected to each pin, but abnormal leads which are open at the buffer or shorted to ground do not have such a range. In such a way, each pin P1–P8 is individually tested to check for open and the short.

For instance, as shown in FIG. 1, under the condition that the pins P3 and P4 are shorted to each other, when an approximately 100 μA current is applied to the pins P3 and P4, the applied current flows to the diodes which are connected in a positive direction in the diode units 113 and 114 and a normal voltage appears on the pins P3 and P4, but, if a short between the pins P3 and P4 exists, no voltage would be detected.

For the test regarding the leakage current, a power supply voltage or a voltage of 0V is applied to the pins P1, P2, P3 and P4 so that current flowing to the pins P1, P2, P3 and P4 can be measured. Also, the output pins P5, P7 and P8 are controlled to be in a high impedance state, and thereafter, a power supply voltage or a voltage of 0V is applied to the pins P5, P7 and P8 to measure the current flowing to the pins P5, P7 and P8. In addition, the output buffer 16 connected to the input/output pin P6 is controlled to be in a high impedance state so that the current flowing to the pin P6 can be measured.

As to the test regarding the output voltage level $V_{OH}/V_{OL}$ and the output current $I_{OL}/I_{OL}$, in case that the input/output pin P6 is actuated as an output lead, the output buffers 16, 15, 17 and 18 each corresponding to the pin P6 and the output pins P5, P7 and P8 are controlled to be in a high or low logic condition so that an output voltage or an output current can be measured.

As to the test regarding an input voltage level $V_{IH}/V_{IL}$, a test pattern data signal having a specific voltage level is inputted to the input buffers 11, 12, 13 and 14 each corresponding to the pins P1, P2, P3 and P4 through the input pins P1, P2, P3 and P4 so that a result appearing at the output pins P5, P7 and P8 can be measured, to thereby measure a threshold voltage of the input buffers 11, 12, 13, 14 and 26.

However, such an input/output device in the conventional integrated circuit and the test for the integrated circuit as described above have disadvantages in that the pins are shorted to each other in the integrated circuit and it takes much time for controlling the output buffers at a high or a low logic condition regarding the test for the levels of the output voltage and current. Moreover, in case of the test for the leakage current, there occurs a problem that time and effort are required for controlling all of the output buffers to be in the high impedance state, and even further it can occur that a test is impossible because an output buffer is not able to be controlled in the high impedance state. And, as to the test regarding the level of the input voltage, since the measured threshold voltage is much influenced from an effect of an operational condition of the core logic, this can result in a problem that a threshold voltage only of the input buffers is hardly measured.

SUMMARY OF THE INVENTION

Therefore, an object of the present invention is to provide an input/output device in an integrated circuit capable of effectively performing an electrical test and reducing the time required for the electrical test in a highly integrated circuit having interface pins which are multi-purpose.

In order to obtain the above object, there is provided an input/output buffer unit including: a plurality of input buffer units for buffering a data signal or a test data signal provided through each input pin to output it to a core logic, and outputting an inverted test data signal, according to a first test signal; a plurality of output buffer units for selecting and buffering the data signal provided from the core logic or the test data signal, outputting the buffered data to each output pin, and outputting an inverted test data signal, according to the first test signal; and a plurality of input/output buffer units for buffering the data signal provided from the core logic or the test data signal to output it to each input/output pin and output an inverted test data signal, and buffering the data signal inputted through each input/output pin to output it to the core logic.

DETAILED DESCRIPTION OF THE INVENTION

The construction of the present invention will now be described with reference to the accompanying drawings.

Figure 3:
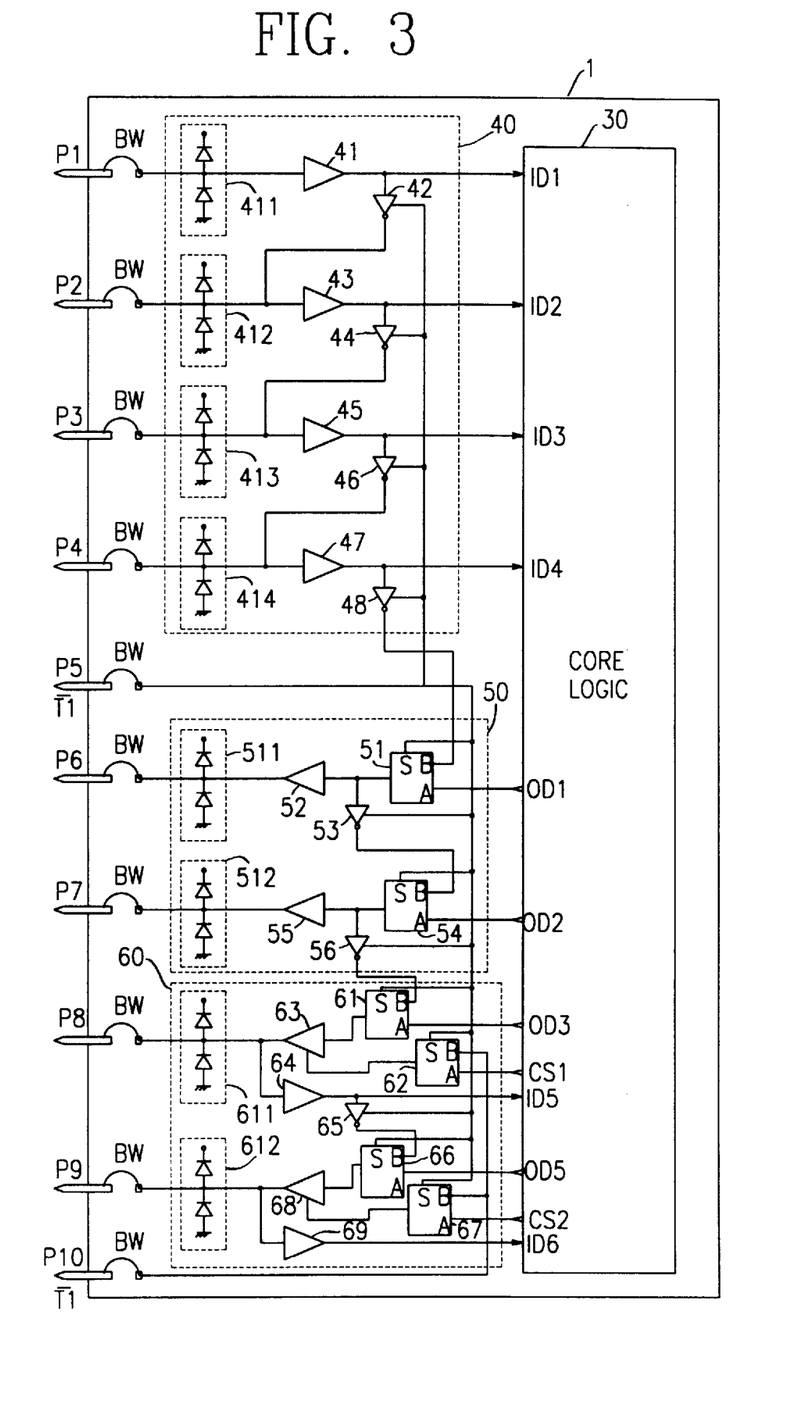
FIG. 3 is a circuit diagram of an input/output device in accordance with the present invention.

Referring to FIG. 3, an input/output device in an integrated circuit according to the present invention, for instance, in case of having ten interface pins P1–P10 in an integrated circuit 1, includes an input unit 40 for buffering a data signal inputted through input pins P1, P2, P3 and P4 and outputting the buffered data signals ID1, ID2, ID3 and ID4, according to a test signal T1 inputted through a pin P5; a core logic 30 for suitably processing the data signals ID1, ID2, ID3 and ID4 provided from the input unit 40; an output unit 50 for buffering the data signals OD1 and OD2 provided from the core logic 30 according to the test signal T1 and outputting the buffered data signals to the pins P6 and P7; and an input/output unit 60 for buffering data signals inputted through the input/output pins P8 and P9 to output the buffered data signals ID5 and ID6 to the core logic 30 according to both a test signal T2 inputted through the pin P10 and input/output control signals CS1 and CS2, or buffering the data signals OD3 and OD5 provided from the core logic 30 to output the buffered data signals to the pins P8 and P9.

The input unit 40 includes a diode unit 411 connected to the pin P1 by a bonding wire BW; an input buffer 41 connected to the diode unit 411 for providing the buffered data signal ID1 to the core logic 30; an invertor 42 being enabled by the test signal T1 inputted through the pin P5 and inverting the data signal ID1 provided from the input buffer 41; a diode unit 412 connected to the pin P2 by a bonding wire BW; an input buffer 43 commonly connected to the diode unit 412 and an output terminal of the invertor 42 for outputting the buffered data signal ID2 to the core logic 30; an invertor 44 being enabled by the test signal T1 and inverting the data signal ID2 provided from the input buffer 43; a diode unit 413 connected to the pin P3 by a bonding wire BW; an input buffer 45 commonly connected to the diode unit 413 and an output terminal of the invertor 44 for outputting the buffered data signal ID3 to the core logic 30;

an invertor 46 being enabled by the test signal T1 and inverting the data signal ED3 provided from the input buffer 45; a diode unit 414 connected to the pin P4 by a bonding wire BW; an input buffer 47 commonly connected to the diode unit 414 and an output terminal of the invertor 46 for outputting the buffered data signal ID4 to the core logic 30; and an invertor 48 being enabled by the test signal T1 and inverting the data signal ID4 provided from the input buffer 47.

The output unit 50 includes a multiplexer 51 for selecting either the data signal OD1 provided from the core logic 30 or the data signal provided from the invertor 48 of the input unit 40 according to the test signal T1; an output buffer 52 for buffering a data signal provided from the multiplexer 51; a diode unit 511 connected to an output terminal of the output buffer 52 and to the pin P6 by a bonding wire BW; an invertor 53 for inverting the data signal provided from the multiplexer 51 according to the test signal T1; a multiplexer 54 for selecting either the data signal OD2 provided from the core logic 30 or the data signal provided from the invertor 53 according to the test signal T1; an output buffer 55 for buffering the data signal provided from the multiplexer 54; a diode unit 512 connected to an output terminal of the output buffer 55 and to the pin P7 by a bonding wire BW; and an invertor 56 for inverting the data signal provided from the multiplexer 54 according to the test signal T1.

The input/output unit 60 includes a multiplexer 61 for selecting either the data signal OD3 provided from the core logic 30 or the data signal provided from the invertor 56 of the output unit 50 according to the test signal T1; a multiplexer 62 for selecting either the input/output control signal CS1 provided from the core logic 30 or the test signal T2 inputted through the pin P10 according to the test signal T1; an output buffer 63 for buffering the data signal provided from the multiplexer 61 according to the signal provided from the multiplexer 62; a diode unit 611 connected to the output buffer 63 and to the pin P8 by a bonding wire BW; an input buffer 64 connected to both an output terminal of the output buffer 63 and the diode unit 611 for buffering the data signal inputted through the pin P8 and outputting a buffered data signal ID5 to the core logic 30; an invertor 65 for inverting the data signal ID5 provided from the input buffer 64; a multiplexer 66 for selecting either the data signal OD4 provided from the core logic 30 or the data signal provided from the invertor 65 according to the test signal T1; a multiplexer 67 for selecting either the input/output control signal CS2 provided from the core logic 30 or the test signal T2 inputted through the pin P10 according to the test signal T1; an output buffer 68 for buffering the data signal provided from the multiplexer 66 according to the signal provided from the multiplexer 67; a diode unit 612 connected to the output buffer 68 and also connected to the pin P9 by a bonding wire BW; and an input buffer 69 commonly connected to an output terminal of the output buffer 68 and the diode unit 612 for buffering the data signal inputted through the pin P9 and outputting the buffered data signal ID6 to the core logic 30.

The output buffers 63 and 68 have the same construction as that of the output buffer 16 of FIG. 2.

Figure 4:
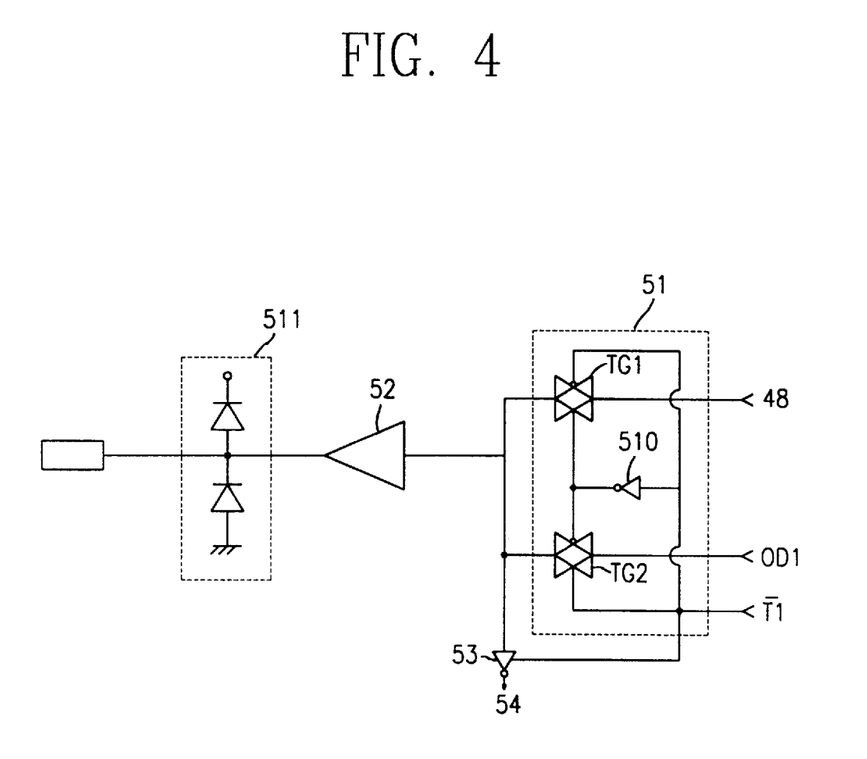
FIG. 4 is a detailed view of a multiplexer of FIG. 3.

As shown in FIG. 4, The multiplexer 51 includes an invertor 510 for inverting the test signal T1; a transmission gate TG1 for transmitting a signal provided from the invertor 48 to both the output buffer 52 and the invertor 53 according to the test signal T1 and the output signal of the invertor 510; and a transmission gate TG2 for transmitting the data signal OD1 provided from the core logic 30 to both the output buffer 52 and the invertor 53 according to the test signal T1 and the output signal of the invertor 510. The other multiplexers 54, 61, 66 and 67 have the same construction as the multiplexer 51.

The operation and effect according to the present invention as constructed above will now be described.

First, an operation of the input/output device according to the present invention in view of testing direct current characteristics is as follows. As to the test regarding the existence or nonexistence of an open or short circuit, when a low level test signal T1 is inputted through the pin P5, the invertors 42, 44, 46 and 48 are enabled and the multiplexers 51, 54, 61, 62, 66 and 67 each select data signals inputted to a B terminal thereof, respectively.

On the other hand, when a high level data signal is applied to the pin P1, the high level data signal is sequentially inverted by the invertors 42, 44, 46 and 48. Then, when a high level data signal provided from the invertor 48 is inputted to the B terminal of the multiplexer 51, a high level data signal is provided from the multiplexer 51 to both the output buffer 52 and the invertor 53, while a low level data signal is provided from the multiplexer 54 to both the output buffer 55 and the invertor 56.

And, when the high level test signal 12 is commonly inputted to each B terminal of the multiplexers 62 and 67 through the pin P10, then the output buffers 63 and 68 are respectively enabled by the output signal of the multiplexer 62.

Accordingly, when the high level data signal provided from the invertor 56 is inputted to the B terminal of the multiplexer 61, the high level data signal is outputted from the output buffer 63. The outputted high level data signal is inputted to the invertor 65 through the input buffer 64. Subsequently, when the low level data signal provided from the invertor 65 is inputted to the B terminal of the multiplexer 66, a low level data signal is outputted from the output buffer 68.

Consequently, when the high level data signal is inputted to the pin P1, a low level data signal is provided from the pins P2, P4, P7 and P9 and a high level data signal is provided from the pins P3, P6 and P8. On the other hand, when a low level data signal is inputted to the pin P1, a data signal of opposite level thereto is provided from the pins P2–P9.

Therefore, the existence or nonexistence of an open or short circuit can be tested by the function testing method, and even in an integrated circuit having a plurality of pins, a fault that pins are shorted to each other within the integrated circuit 1 can be detected rapidly by a two-step test pattern.

That is, as to an integrated circuit having a hundred pins, when testing for the existence or nonexistence of and open or short circuit is performed by using the conventional technique, assuming that it takes 5 ms test time per one pin, a total 500 $\mu$s of test time is required.

However, in case of applying the present functional test thereto, the time required for the testing is determined by the number of steps of the test pattern, regardless of the number of pins of the integrated circuit. Accordingly, when a 1 MHZ test frequency is used, since a cycle of 1 MHZ is 1 $\mu$s and a two-step test pattern is used, thus, a total of 2 $\mu$s test time is taken.

As to the test for leakage current, when the high level test signal T1 is inputted through the pin P5, the invertors 42, 44, 46, 48, 53 and 56 are disabled, respectively, so that the pins P1, P2, P3, P4, P6 and P7 are put in dielectrically isolated relation to each other. The leakage current can be tested in this dielectric isolation condition.

In the meantime, when the high level test signal T1 and the low level test signal T2 are inputted to the multiplexers 62 and 67, a low level signal is outputted to the output buffers 63 and 68, so that the output buffers 63 and 68 are turned to a high impedance state.

As to the test regarding the level of an output voltage $V_{OH}/V_{OL}$ and the level of output current $I_{ON}/I_{OL}$, when the low level test signal T1 is inputted to the pin P5, the invertors 42, 44, 46, 48, 53, 56 and 65 are all enabled, whereas when the high level test signal T2 is inputted to the pin P10, the output buffer 63 buffers the data signal provided from the multiplexer 61 to output it and the output buffer 68 buffers the data signal provided from the multiplexer 66 to output it, according to the high level test signal T2.

Accordingly, when a high level data signal is inputted to the pin P1, by the same operation as described above regarding the test for existence and nonexistence of an open or short circuit, a low level data signal is outputted from the pins P2, P4, P7 and P9 and a high level data signal is outputted from the pins P3, P6 and P8. On the other hand, when a low level data signal is inputted to the pin P1, a data signal of the opposite level thereto is outputted from the pins P2–P9.

Subsequently, an output voltage level $V_{OH}$ and an output current level $I_{OH}$ are measured from the pins from which the high level data signal is outputted, while an output voltage level $V_{OL}$ and an output current level $L_{OL}$ are measured from the pins from which the low level data signal is outputted.

Consequently, according to the two-step pattern having a step of applying the high level data signal to the pin P1 and a step of applying the low level data signal to the pin P1, the output voltage level $V_{OH}/V_{OL}$ and the output current level $I_{OH}/I_{OL}$ for all pins can be tested by adapting such functional test.

As to the test regarding an input voltage level $V_{IH}/V_{IL}$, when the low level test signal T1 is inputted to the pin P5, the data signal inputted to the pin P1 is inverted by the invertor 42 through the input buffer 41 and the inverted data signal is inputted to the pin P2. Accordingly, a threshold voltage of the input buffer 41 can be measured at the pin P2, so that the input voltage level $V_{IH}/V_{IL}$ regarding the input buffer 41 can be tested regardless of an operational condition of the core logic 30.

Likewise, a variation of the input voltage level $V_{IH}/V_{IL}$ for a pin 'n' appears on a pin 'n+1', so that the input voltage level $V_{IH}/V_{IL}$ regarding the input buffer connected to the 'n' pin can be tested regardless of the operational condition of the core logic 30.

As so far described, in the input/output device of the integrated circuit according to the present invention, since the functional test is performed according to the test signal, the time required for both the test for the output voltage level and the output current level and the test for the open and short circuits can be reduced. Also, the input/output buffer is readily controlled in a high impedance state according to the test signal, so that time required for testing the leakage current can be reduced. Moreover, the input voltage level for the input buffers can be tested without having any influence from the core logic.

What is claimed is:

1. An input/output device in an integrated circuit having a core logic and a plurality of input pins, input/output pins, and output pins, comprising:

a plurality of input buffer units for buffering an input data signal provided through each input pin or a test data signal to output it to the core logic, and for outputting an inverted second test data signal according to inputting of a first test signal;

a plurality of output buffer units for selecting and buffering a data signal provided from the core logic or the test data signal to output it to each output pin, and inverting and outputting the inverted second test data signal according to inputting of the first test signal; and at least one input/output buffer units for selecting and buffering one of (1) the data signal provided from the core logic or the test data signal to output it to each input/output pin and (2) the input data signal inputted through each input/output pin or the test data signal to output it to the core logic, and for inverting and outputting the inverted second test data signal according to the first test signal.

2. The device according to claim 1, wherein the plurality of input buffer units each includes:

an input buffer having an input terminal connected to corresponding input pin and an output terminal of which is connected to the core logic; and an invertor being enabled by the first test signal, for inverting the input test data signal provided from the input buffer and outputting the inverted second test data signal.

3. The device according to claim 1, wherein the plurality of input buffer units are sequentially arranged according to an order of each input pin, and an output terminal of an invertor included in each input buffer unit is connected to an input terminal of an input buffer included in a next sequential input buffer unit.

4. The device according to claim 1, wherein the plurality of output buffer units each includes:

a multiplexer being controlled according to the first test signal for selecting an input test data signal during a test regarding direct current characteristics;

an output buffer for buffering an output signal of the multiplexer and outputting the buffered signal to corresponding output pin; and an invertor being enabled by the first test signal for inverting the output signal of the multiplexer and outputting the inverted second test data signal.

5. The apparatus according to claim 4, wherein the plurality of output buffer units are sequentially arranged according to an order of each output pin, a multiplexer of the first output buffer unit receives the second test data signal provided from the last input buffer unit of the plurality of input buffer units, and an output signal of the invertor included in one output buffer unit is inputted to the multiplexer included in the next output buffer unit.

6. The device according to claim 1, wherein the plurality of input/output buffer units, in testing direct current characteristics, each includes:

a first multiplexer being controlled according to the first test signal for selecting an input test data signal;

a second multiplexer being controlled according to the first test signal for selecting a second test signal;

an output buffer for buffering the output signal of the first multiplexer and outputting the buffered signal to corresponding output pin, according to the output signal of the second multiplexer;

an input buffer for buffering the output signal of the output buffer or an input signal; and an invertor for inverting the output signal of the input buffer and outputting the second test data signal.

7. The device according to claim 6, wherein the plurality of the input/output buffer units are sequentially arranged according to an order of each input/output pin, a first multiplexer of the first input buffer receives the second test data signal provided from the last output buffer unit of the plurality of the output buffer units, an output signal of the invertor included in one input/output buffer unit is inputted to the first multiplexer included in the next input/output buffer unit, and the last input/output buffer unit does not include any invertor.

8. An input/output device in an integrated circuit having a core logic and a plurality of input pins, input/output pins and output pins, comprising:

a plurality of input buffer units that buffers a first signal provided through each input pin to output it to the core logic and that outputs a second signal based on a received first test signal; and a plurality of input/output buffer units that selects and buffers the first signal provided from the core logic to output it to a corresponding one of the input/output pins or buffers the first signal provided by the corresponding one of the input/output pins to output it to the core logic, and that outputs the second signal based on the received first test signal, wherein the second signal is output to a subsequent buffer unit except for a final buffer unit.

9. The input/output device of claim 8, wherein a two part test signal provides a short/open test of the input/output device.

10. The input/output device of claim 8, wherein a two cycle test signal provides direct current characteristics test of the input/output device.

11. The input/output device of claim 8, further comprising a plurality of output buffer units that selects and buffers the first signal provided from the core logic to output it to a corresponding one of the output pins and that outputs the second signal based on the received first test signal.

12. The input/output device of claim 8, wherein each of the buffer units is directly coupled to a subsequent buffer unit except for the final buffer unit.

13. The input/output device of claim 8, wherein each buffer unit includes a logic circuit to generate the second signal.

14. The input/output device of claim 8, wherein each buffer unit includes a logic gate to generate the second signal, wherein the logic gate is an inverter.

15. The input/output device of claim 8, wherein the first signal is an input data signal or a first test signal and the second signal is a second test data signal.

* * * * *

UNITED STATES PATENT AND TRADEMARK OFFICE
CERTIFICATE OF CORRECTION

PATENT NO. : 5,826,004
DATED : October 20, 1998
INVENTOR(S) : Jeong H. BAE

It is certified that error appears in the above-identified patent and that said Letters Patent is hereby corrected as shown below:

On the title page,
   [30] Foreign Application Priority Data

October 2, 1995  [KR]  Rep. of Korea 33692/1995

Signed and Sealed this

Eighteenth Day of May, 1999

Attest:

Q. TODD DICKINSON

Attesting Officer     Acting Commissioner of Patents and Trademarks